United States Patent
Lin et al.

(10) Patent No.: US 8,004,736 B2
(45) Date of Patent: Aug. 23, 2011

(54) OPTICAL INTERFERENCE DISPLAY PANEL AND MANUFACTURING METHOD THEREOF

(75) Inventors: Wen-Jian Lin, Hsinchu (TW); Brian Arbuckle, Danville, CA (US); Brian Gally, Los Gatos, CA (US); Philip Floyd, Redwood City, CA (US); Lauren Palmateer, San Francisco, CA (US)

(73) Assignee: Qualcomm MEMS Technologies, Inc., San Diego, CA (US)

( * ) Notice: Subject to any disclaimer, the term of this patent is extended or adjusted under 35 U.S.C. 154(b) by 0 days.

(21) Appl. No.: 12/463,312

(22) Filed: May 8, 2009

(65) Prior Publication Data
US 2009/0219605 A1 Sep. 3, 2009

Related U.S. Application Data

(62) Division of application No. 10/807,128, filed on Mar. 24, 2004, now Pat. No. 7,532,385.

(30) Foreign Application Priority Data

Aug. 18, 2003 (TW) ............... 92122676 A

(51) Int. Cl.
G02B 26/00 (2006.01)
(52) U.S. Cl. ........................ 359/237
(58) Field of Classification Search .......... 359/245, 359/246, 254, 247, 290–295, 298, 223, 224; 438/253, 396
See application file for complete search history.

(56) References Cited

U.S. PATENT DOCUMENTS

| | | | |
|---|---|---|---|
| 4,074,480 A | 2/1978 | Burton | |
| 4,310,220 A | 1/1982 | Kuwagaki et al. | |
| 4,383,255 A | 5/1983 | Grandjean et al. | |
| 4,459,182 A | 7/1984 | te Velde | |

(Continued)

FOREIGN PATENT DOCUMENTS

CN 1449990 10/2003
(Continued)

OTHER PUBLICATIONS

Greco et al., Optical properties of IPN-like networks polyethylene/poly(butylmethacrylate-co-styrene copolymer systems, III. Influence of copolymer crosslinkers, Polymer 42 (2001), 5089-5095.

(Continued)

*Primary Examiner* — William C Choi
*Assistant Examiner* — Tuyen Tra
(74) *Attorney, Agent, or Firm* — Knobbe Martens Olson & Bear LLP

(57) ABSTRACT

A first electrode and a sacrificial layer are sequentially formed on a substrate, and then first openings for forming supports inside are formed in the first electrode and the sacrificial layer. The supports are formed in the first openings, and then a second electrode is formed on the sacrificial layer and the supports, thus forming a micro electro mechanical system structure. Afterward, an adhesive is used to adhere and fix a protection structure to the substrate for forming a chamber to enclose the micro electro mechanical system structure, and at least one second opening is preserved on sidewalls of the chamber. A release etch process is subsequently employed to remove the sacrificial layer through the second opening in order to form cavities in an optical interference reflection structure. Finally, the second opening is closed to seal the optical interference reflection structure between the substrate and the protection structure.

18 Claims, 5 Drawing Sheets

U.S. PATENT DOCUMENTS

| | | | |
|---|---|---|---|
| 4,956,619 A | 9/1990 | Hornbeck | |
| 5,018,256 A | 5/1991 | Hornbeck | |
| 5,099,353 A | 3/1992 | Hornbeck | |
| 5,216,537 A | 6/1993 | Hornbeck | |
| 5,244,707 A | 9/1993 | Shores | |
| 5,268,533 A | 12/1993 | Kovacs et al. | |
| 5,322,161 A | 6/1994 | Shichman et al. | |
| 5,331,454 A | 7/1994 | Hornbeck | |
| 5,401,983 A | 3/1995 | Jokerst et al. | |
| 5,683,591 A * | 11/1997 | Offenberg | 216/2 |
| 5,717,476 A | 2/1998 | Kanezawa | |
| 5,771,321 A | 6/1998 | Stern | |
| 5,784,166 A | 7/1998 | Sogard | |
| 5,784,189 A | 7/1998 | Bozler et al. | |
| 5,835,255 A | 11/1998 | Miles | |
| 5,837,562 A | 11/1998 | Cho | |
| 5,853,662 A | 12/1998 | Watanabe | |
| 5,856,820 A | 1/1999 | Weigers et al. | |
| 5,936,758 A | 8/1999 | Fisher et al. | |
| 5,939,785 A | 8/1999 | Klonis et al. | |
| 5,959,763 A | 9/1999 | Bozler et al. | |
| 5,986,796 A | 11/1999 | Miles | |
| 5,999,306 A | 12/1999 | Atobe et al. | |
| 6,040,937 A | 3/2000 | Miles | |
| 6,055,090 A | 4/2000 | Miles | |
| 6,107,115 A | 8/2000 | Atobe et al. | |
| 6,120,339 A | 9/2000 | Alwan | |
| 6,127,765 A | 10/2000 | Fushinobu | |
| 6,195,196 B1 | 2/2001 | Kimura et al. | |
| 6,238,755 B1 | 5/2001 | Harvey et al. | |
| 6,303,986 B1 | 10/2001 | Shook | |
| 6,365,229 B1 | 4/2002 | Robbins | |
| 6,379,988 B1 | 4/2002 | Peterson et al. | |
| 6,426,124 B2 | 7/2002 | Olster et al. | |
| 6,426,461 B1 | 7/2002 | Ginter et al. | |
| 6,447,126 B1 | 9/2002 | Hornbeck | |
| 6,455,927 B1 | 9/2002 | Glenn et al. | |
| 6,462,392 B1 | 10/2002 | Pinter et al. | |
| 6,465,355 B1 | 10/2002 | Horsley | |
| 6,466,354 B1 | 10/2002 | Gudeman | |
| 6,472,739 B1 | 10/2002 | Wood et al. | |
| 6,489,670 B1 | 12/2002 | Peterson et al. | |
| 6,495,895 B1 | 12/2002 | Peterson et al. | |
| 6,507,385 B1 | 1/2003 | Nishiyama et al. | |
| 6,525,416 B2 | 2/2003 | Hauser et al. | |
| 6,538,312 B1 | 3/2003 | Peterson et al. | |
| 6,558,820 B2 | 5/2003 | Raychaudhuri et al. | |
| 6,583,921 B2 | 6/2003 | Nelson | |
| 6,589,625 B1 | 7/2003 | Kothari et al. | |
| 6,603,182 B1 | 8/2003 | Low et al. | |
| 6,650,455 B2 | 11/2003 | Miles | |
| 6,661,084 B1 | 12/2003 | Peterson et al. | |
| 6,674,159 B1 | 1/2004 | Peterson et al. | |
| 6,674,562 B1 | 1/2004 | Miles et al. | |
| 6,680,792 B2 | 1/2004 | Miles | |
| 6,690,444 B1 | 2/2004 | Wilkinson et al. | |
| 6,778,046 B2 | 8/2004 | Stafford et al. | |
| 6,779,260 B1 | 8/2004 | Brandenburg et al. | |
| 6,794,119 B2 | 9/2004 | Miles | |
| 6,833,668 B1 | 12/2004 | Yamada et al. | |
| 6,843,936 B1 | 1/2005 | Jacobs | |
| 6,867,896 B2 | 3/2005 | Miles | |
| 6,882,458 B2 | 4/2005 | Lin et al. | |
| 6,882,480 B2 | 4/2005 | Yanagisawa | |
| 6,914,245 B2 | 7/2005 | Sone et al. | |
| 6,940,631 B2 | 9/2005 | Ishikawa | |
| 6,977,391 B2 | 12/2005 | Frischknecht | |
| 6,995,890 B2 | 2/2006 | Lin | |
| 6,999,225 B2 | 2/2006 | Lin et al. | |
| 7,012,732 B2 | 3/2006 | Miles | |
| 7,019,458 B2 | 3/2006 | Yoneda | |
| 7,042,643 B2 | 5/2006 | Miles | |
| 7,046,374 B1 | 5/2006 | Barbarossa | |
| 7,123,216 B1 | 10/2006 | Miles | |
| 7,153,016 B2 | 12/2006 | Chen | |
| 7,307,776 B2 | 12/2007 | Miles et al. | |
| 7,393,712 B2 * | 7/2008 | Smith et al. | 438/51 |
| 7,470,373 B2 | 12/2008 | Tsai | |
| 7,532,385 B2 | 5/2009 | Lin | |
| 7,746,537 B2 | 6/2010 | Natarajan | |
| 2001/0004085 A1 | 6/2001 | Gueissaz | |
| 2001/0055146 A1 | 12/2001 | Atobe et al. | |
| 2002/0012364 A1 | 1/2002 | Kalian et al. | |
| 2002/0043706 A1 | 4/2002 | Jerominek et al. | |
| 2002/0052392 A1 | 5/2002 | Day et al. | |
| 2002/0056898 A1 | 5/2002 | Lopes et al. | |
| 2002/0056900 A1 | 5/2002 | Liu et al. | |
| 2002/0057565 A1 | 5/2002 | Seo | |
| 2002/0075551 A1 | 6/2002 | Daneman | |
| 2002/0075555 A1 | 6/2002 | Miles | |
| 2002/0160583 A1 | 10/2002 | Song | |
| 2002/0187254 A1 | 12/2002 | Ghosh | |
| 2003/0043157 A1 | 3/2003 | Miles | |
| 2003/0054588 A1 | 3/2003 | Patel et al. | |
| 2003/0062186 A1* | 4/2003 | Boroson et al. | 174/52.2 |
| 2003/0072070 A1 | 4/2003 | Miles | |
| 2003/0075794 A1 | 4/2003 | Felton et al. | |
| 2003/0108306 A1 | 6/2003 | Whitney et al. | |
| 2003/0144034 A1 | 7/2003 | Hack et al. | |
| 2003/0152787 A1 | 8/2003 | Arakawa et al. | |
| 2003/0152872 A1 | 8/2003 | Miles | |
| 2003/0161126 A1 | 8/2003 | Wilkinson et al. | |
| 2003/0184412 A1 | 10/2003 | Gorrell | |
| 2004/0051929 A1 | 3/2004 | Sampsell et al. | |
| 2004/0061492 A1 | 4/2004 | Lopes et al. | |
| 2004/0076008 A1 | 4/2004 | Ikeda | |
| 2004/0080382 A1 | 4/2004 | Nakanishi et al. | |
| 2004/0100677 A1 | 5/2004 | Huibers et al. | |
| 2004/0126953 A1 | 7/2004 | Cheung | |
| 2004/0140557 A1 | 7/2004 | Sun et al. | |
| 2004/0166606 A1 | 8/2004 | Forehand | |
| 2004/0173886 A1 | 9/2004 | Carley | |
| 2004/0184133 A1 | 9/2004 | Su et al. | |
| 2004/0218251 A1 | 11/2004 | Piehl et al. | |
| 2005/0093134 A1* | 5/2005 | Tarn | 257/706 |
| 2005/0253283 A1* | 11/2005 | DCamp et al. | 257/787 |
| 2005/0254982 A1 | 11/2005 | Cadeddu | |
| 2005/0275079 A1 | 12/2005 | Stark | |
| 2006/0274400 A1 | 12/2006 | Miles | |
| 2010/0144230 A1 | 6/2010 | Tyger | |

FOREIGN PATENT DOCUMENTS

| | | |
|---|---|---|
| EP | 0 695 959 | 2/1996 |
| EP | 0 822 570 | 2/1998 |
| EP | 1 418 154 | 5/2004 |
| EP | 1 433 742 | 6/2004 |
| FR | 2841380 | 12/2003 |
| JP | 61-206244 | 9/1986 |
| JP | 63-162378 | 10/1988 |
| JP | 10-70287 | 3/1998 |
| JP | 08-162006 | 6/1998 |
| JP | 11 337953 | 12/1999 |
| JP | 2001-318324 | 11/2001 |
| JP | 2001-351998 | 12/2001 |
| JP | 2002-062491 | 2/2002 |
| JP | 2002-062492 | 2/2002 |
| JP | 2002-258310 | 9/2002 |
| JP | 2002-296519 | 10/2002 |
| JP | 2002-312066 | 10/2002 |
| JP | 2002-328313 | 11/2002 |
| JP | 2002-357846 | 12/2002 |
| JP | 2003-075741 | 3/2003 |
| JP | 2003-233024 | 8/2003 |
| JP | 2003-330001 | 11/2003 |
| JP | 2004-053852 | 2/2004 |
| JP | 2004-78107 | 3/2004 |
| JP | 2004-118001 | 4/2004 |
| WO | WO 90/05795 | 5/1990 |
| WO | WO 94/28452 | 12/1994 |
| WO | WO 95/01624 | 1/1995 |
| WO | WO 98/06118 | 2/1998 |
| WO | WO 00/16105 | 3/2000 |
| WO | WO 00/17695 | 3/2000 |
| WO | WO 01/45140 | 6/2001 |
| WO | WO 01/58804 | 8/2001 |
| WO | WO 02/042716 | 5/2002 |
| WO | WO 03/023849 | 3/2003 |

| WO | WO 03/026369 | 3/2003 |
| WO | WO 03/054925 | 3/2003 |
| WO | WO 03/070625 | 8/2003 |
| WO | WO 03/084861 | 10/2003 |
| WO | WO 03/095706 | 11/2003 |
| WO | WO 03/105198 | 12/2003 |
| WO | WO 2004/077523 | 9/2004 |

OTHER PUBLICATIONS

Miles, MEMS-based interferometric modulator for display applications, Proceedings of the SPIE Micromachined Devices and Components V, Sep. 1999, pp. 20-28.

Moraja, et al., Advanced Getter Solutions at Wafer Level to Assure High Reliability to the last Generations MEMS, IEEE Reliability Physics Symposium Proceedings, 2003, pp. 458-459.

Sparks, et al. Chip-Level Vacuum Packaging of Micromachines Using NanoGetters, IEEE Transactions on Advanced Packaging, vol. 26 Issue 3, Aug. 2003, pp. 277-282.

Stark et al., An integrated process for post-packaging release and vacuum sealing of electroplated nickel packages, Transducers, 12th International Conference on Solid-State Sensors, Actuators and Microsystems, 2003, pp. 1911-1914.

Tilmans et al., The indent reflow sealing (IRS) technique—A method for the fabrication of scaled cavities for mems devices, Journal of Microelectromechanical Systems, 9(2), Jun. 2000.

Office Action received May 17, 2006 in Chinese App. No. 03157908.6.

Office Action received Nov. 13, 2006 in Chinese App. No. 03157908.6.

Office Action received Jun. 25, 2007 in Chinese App. No. 03157908.6.

Office Action issued Jan. 31, 2006 in Korean App. No. 10-2004-0043323.

Office Action dated Jul. 14, 2008 in U.S. Appl. No. 10/807,128.

* cited by examiner

OPTICAL INTERFERENCE DISPLAY PANEL AND MANUFACTURING METHOD THEREOF

CROSS REFERENCE TO RELATED APPLICATIONS

This application is a division of U.S. application Ser. No. 10/807,128 filed on Mar. 24, 2004, which claims priority to Taiwanese application TW/92122676 filed on Aug. 18, 2003, each of which are incorporated by reference hereby in their entirety.

BACKGROUND OF THE INVENTION

1. Field of Invention

The present invention relates to a display panel. More particularly, the present invention relates to an optical interference display panel.

2. Description of Related Art

Due to being lightweight and small in size, a display panel is favorable in the market of portable displays and other displays with space limitations. To date, in addition to liquid crystal display (LCD), organic light emitting diode (OLED) and plasma display panel (PDP) modules, a module of the optical interference display has been investigated.

U.S. Pat. No. 5,835,255 discloses a modulator array, that is, a color-changeable pixel for visible light which can be used in a display panel. FIG. 1A illustrates a cross-sectional view of a prior art modulator. Every modulator 100 comprises two walls, 102 and 104. These two walls are supported by posts 106, thus forming a cavity 108. The distance between these two walls, the depth of cavity 108, is D. The wall 102 is a light-incident electrode which, according to an absorption factor, absorbs visible light partially. The wall 104 is a light-reflection electrode that is flexed when a voltage is applied to it.

When the incident light shines through the wall 102 and arrives at the cavity 108, only the visible light with wavelengths corresponding to the formula 1.1 is reflected back, that is, $$2D = N\lambda \tag{1.1}$$

wherein N is a natural number.

When the depth of the cavity 108, D, equals one certain wavelength $\lambda_1$ of the incident light multiplied by any natural number, N, a constructive interference is produced, and a light with the wavelength $\lambda_1$ is reflected back. Thus, an observer viewing the panel from the direction of the incident light will observe light with the certain wavelength $\lambda_1$ reflected back at him. The modulator 100 here is in an "open" state.

FIG. 1B illustrates a cross-sectional view of the modulator 100 in FIG. 1A after a voltage is applied to it. Under the applied voltage, the wall 104 is flexed by electrostatic attraction toward the wall 102. At this moment, the distance between the walls 102 and 104, the depth of cavity 108, becomes d and may equal zero.

The D in the formula 1.1 is hence replaced with d, and only the visible light with another certain wavelength $\lambda_2$ satisfying the formula 1.1 produces constructive interference in the cavity 108 and reflects back through the wall 102. However, in the modulator 100, the wall 102 is designed to have a high absorption rate for the light with the wavelength $\lambda_2$. Thus, the incident visible light with the wavelength $\lambda_2$ is absorbed, and the light with other wavelengths has destructive interference. All light is thereby filtered, and the observer is unable to see any reflected visible light when the wall 104 is flexed. The modulator 100 is now in a "closed" state.

As described above, under the applied voltage, the wall 104 is flexed by electrostatic attraction toward the wall 102 such that the modulator 100 is switched from the "open" state to the "closed" state. When the modulator 100 is switched from the "closed" state to the "open" state, the voltage for flexing the wall 104 is removed, and the wall 104 elastically returns to the original state, i.e. the "open" state, as illustrated in FIG. 1A.

However, the light-reflection electrode (the wall 104) is a membrane, typically made of metal, and generally is manufactured with a "sacrificial layer" technique widely used in the production of micro electro mechanical systems (MEMS). The light-reflection electrode is very thin and is easily damaged by even a tiny external force, inhibiting it from functioning properly. Moreover, the cavity 108 that spaces the two walls 102 and 104 is hollow. In practice, an external environment usually affects and lowers the display performance of the color-changeable pixel 100 because of the thin cavity 108.

For example, water in the air tends to adsorb into the cavity 108. The depth D of the cavity is typically less than 1 µm, and therefore the adsorbed water generates an undesirable electrostatic attraction between the two electrodes. When the color-changeable pixel 100 is supposed to be in the "open" state, the electrostatic attraction created by the adsorbed water causes the two walls to be attracted to each other, making the color-changeable pixel 100 appear to be in a "closed" state. The light-reflection electrode can also be hindered from normal switching by dust from the air which can enter into the cavity 108. Additionally, the two thin walls 102 and 104 are easily oxidized by air to such an extent that their optical or electrical properties are adversely affected.

SUMMARY OF THE INVENTION

In consideration of the foregoing problems, the invention provides a protection structure adhered to the substrate, such that the color-changeable pixels are protectively enclosed to improve the problems. However, if the sacrificial layer used during manufacturing is removed before adhering the protection structure to the substrate, the color-changeable pixel produced by the processing sequence slightly mitigates these problems but cannot substantially avoid them. Since the color-changeable pixel is exposed to air during the period between the sacrificial layer being removed and the protection structure being adhered, water, dust and oxygen in the air are still able to affect the color-changeable pixel and lower its display performance.

It is therefore an objective of the present invention to provide an optical interference display panel and manufacturing method that protects its optical interference reflection structure from being damaged by an external environment.

It is another objective of the present invention to provide an optical interference display panel and manufacturing method which enhances the display performance, increases the reliability and prolongs the lifetime of the panel.

It is still another objective of the present invention to provide an optical interference display panel and manufacturing method in which the release etching process is performed after adhering the protection structure to the substrate, to reduce the possibility that water, dust and oxygen in the air damage the optical interference reflection structure therein.

It is still another objective of the present invention to provide an optical interference display panel and manufacturing method in which the substrate, the protection structure and the adhesive form a chamber having an opening such that a release etching process is performed through the opening in order to remove the sacrificial layer of the optical interference reflection structure, thus reducing the possibility of water or oxygen in the air damaging the optical interference reflection structure.

In accordance with the foregoing and other objectives of the present invention, an optical interference display panel and manufacturing method thereof are provided. A first electrode and a sacrificial layer are formed in order on the substrate, and then a plurality of first openings are formed in the first electrode and the sacrificial layer. One support is formed in each of the first openings, and a second electrode is then formed on the sacrificial layer and the supports, thus creating a micro electro mechanical structure.

Next, a protection structure is adhered to the substrate with an adhesive to form a chamber to enclose the micro electro mechanical structure such that at least one second opening is available on the sidewall of the chamber. A release etching process is then performed in which an etching reagent is used to remove the sacrificial layer through the second opening in order to form a cavity in the optical interference reflection structure. Finally, the second opening is closed to hermetically seal the optical interference reflection structure between the substrate and the protection structure.

According to one preferred embodiment of the invention, the optical interference reflection structure comprises a plurality of color-changeable pixels. The substrate and the protection structure are airtight to prevent the optical interference reflection structure from being damaged by an external environment. The protection structure is a flat protection structure, such as a glass substrate. The adhesive comprises a material such as a UV glue, a thermosetting adhesive or other adhesive. The adhesive further comprises spacers.

According to another preferred embodiment of the invention, the protection structure is a U-shaped protection structure or a U-shaped protection structure having the foregoing second opening on a sidewall thereof.

The position, shape and quality of the second opening is not limited, and when the size thereof is larger or the quality thereof is greater, the efficiency of the release etching process is better. If the positions of the second openings are uniformly distributed on the chamber, the uniformity of the etching process is enhanced. The second opening can be formed by cutting or by other methods after the substrate and the protection structure are joined together and completely sealed by the adhesive. Alternatively, the second opening can be formed during the adhering procedure.

In this preferred embodiment, the release etching process is a remote plasma etching process. The remote plasma etching process etches the sacrificial layer with a remote plasma produced by an etching reagent having a fluorine group or a chlorine group, such as CF4, BCl3, NF3, or SF6, as a precursor.

The invention adheres the protection structure to the substrate with an adhesive to form a chamber that encloses the micro electro mechanical structure prior to performing the release etching process. The sidewall of the chamber has at least one opening to be used for removal of the sacrificial layer during the release etching process. Thus, the optical interference reflection structure is protected from being damaged by water, dust and oxygen as a result of being exposed to air during subsequent manufacturing procedures.

The protection structure is adhered to the substrate to enclose the micro electro mechanical structure in order to protect the micro electro mechanical structure from being acted upon directly and thereby damaged by an external force. Furthermore, the optical interference reflection structure is hermetically sealed between the substrate and the protection structure, effectively preventing an external environment, such as water, dust or oxygen in the air, from being in contact with the optical interference reflection structure and consequently-generating electrostatic attraction or oxidizing its metal film which adversely affects its optical and electrical properties. Therefore, the invention enhances the display performance of the optical interference display panel, increases its reliability, and prolongs its lifetime.

It is to be understood that both the foregoing general description and the following detailed description are examples and are intended to provide further explanation of the invention as claimed.

BRIEF DESCRIPTION OF THE DRAWINGS

These and other features, aspects and advantages of the present invention will become better understood with regard to the following description, appended claims and accompanying drawings where:

DESCRIPTION OF THE PREFERRED EMBODIMENTS

Figure 1A:
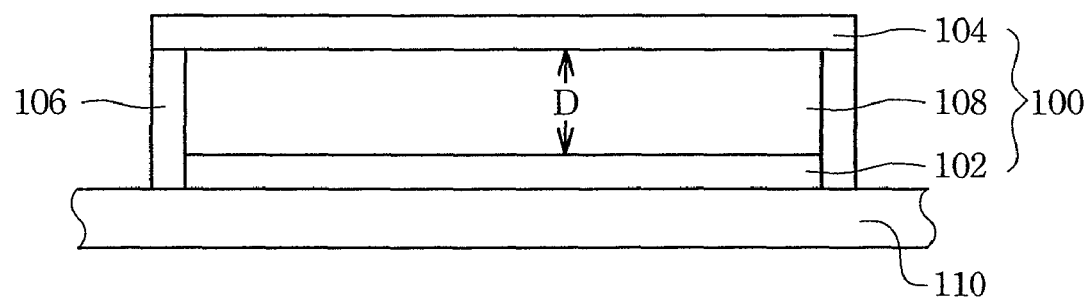
FIG. 1A illustrates a cross-sectional view of a prior art modulator.
Figure 1B:
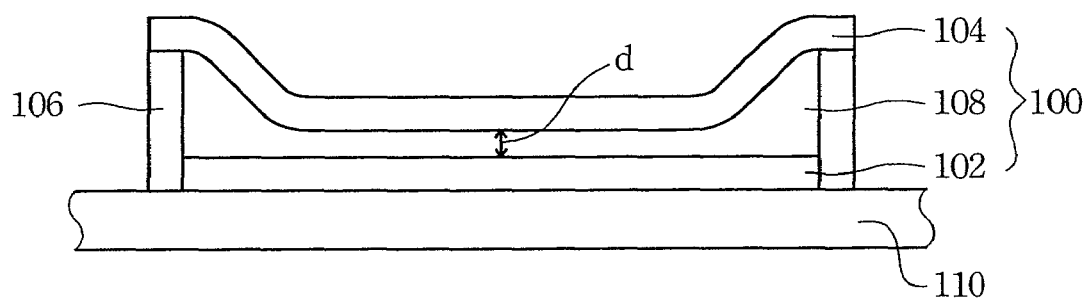
FIG. 1B illustrates a cross-sectional view of the modulator in FIG. 1A after a voltage is applied to it.

Reference will now be made in detail to the present preferred embodiments of the invention, examples of which are illustrated in the accompanying drawings. Wherever possible, the same reference numbers are used in the drawings and the description to refer to the same or like parts.

The manufacturing method of the invention first forms a first electrode and a sacrificial layer in order on the substrate, and then a plurality of first openings are formed in the first electrode and the sacrificial layer. One support is formed in each of the first openings, and a second electrode is then formed on the sacrificial layer and the supports, thus creating a micro electro mechanical structure.

Next, a protection structure is adhered to the substrate with an adhesive in order to form a chamber which encloses the micro electro mechanical structure therein such that at least one second opening is available on the sidewall of the chamber. A release etching process is then performed in which an etching reagent removes the sacrificial layer through the second opening and forms a cavity in the optical interference reflection structure. Finally, the second opening is closed to hermetically seal the optical interference reflection structure between the substrate and the protection structure.

Figure 2A:
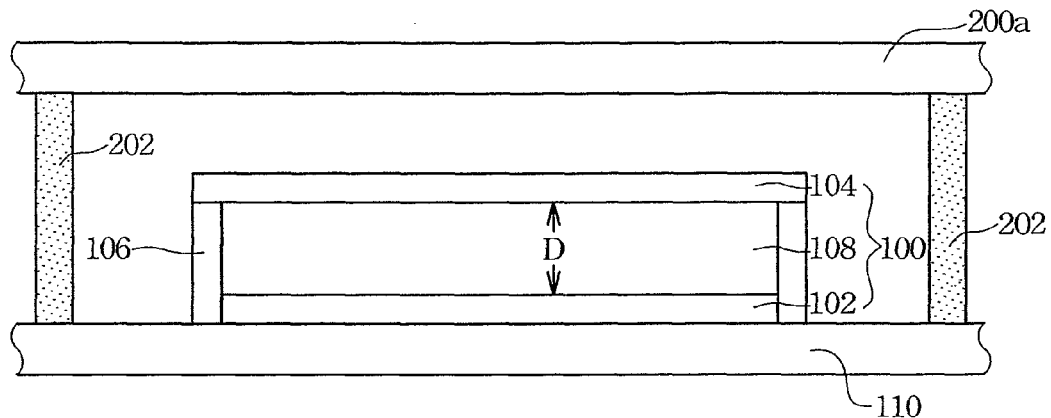
FIG. 2A illustrates a cross-sectional view of one preferred embodiment of the invention.

FIG. 2A illustrates a cross-sectional view of one preferred embodiment of the invention. The optical interference reflection structure has a plurality of color-changeable pixels. For clarity and ease of understanding, the following descriptions and figures use only one color-changeable pixel 100 to represent the optical interference reflection structure inside the optical interference display panel of this preferred embodiment.

As illustrated in FIG. 2A, a flat protection structure 200a is adhered to a substrate 110 with an adhesive 202. The substrate 110 is a glass substrate or a substrate transparent to visible light. The flat protection structure 200a reduces the possibility that an external force reaches the color-changeable pixel 100. Moreover, the adhesive 202 seals the optical interference reflection structure between the substrate 110 and the flat protection structure 200a. The adhesive 202 is used to isolate the color-changeable pixel 100 from an external environment and prevent it from being damaged by water, dust and oxygen in the air.

When water in the air gets into the cavity 108 of the color-changeable pixel 100, the electrostatic attraction caused by the water is very large (because the depth D of the cavity is very small) and thus inhibits the color-changeable pixel 100 from being switched successfully. When the metal film, such as the light-incident electrode or the light-reflection electrode of the color-changeable pixel, is in contact with oxygen, the metal film is very easily oxidized, adversely affecting the optical and electrical properties of the color-changeable pixel 100.

In the preferred embodiment, the adhesive 202 is not only used to adhere the flat protection structure 200a to the substrate 110 but also to isolate the color-changeable pixel 100 from an external environment. The high isolation effectively protects the color-changeable pixel 100 from damage. According to one preferred embodiment of the invention, when the adhesive joins the flat protection structure 200a to the substrate 110 such that the color-changeable pixel is hermetically sealed, the reliability and the lifetime of the color-changeable pixel are substantially increased.

The flat protection structure 200a is a glass structure, or a substrate made of other material like plastic, organic polymer or inorganic polymer. The adhesive 202 comprises a material such as a UV glue or a thermosetting adhesive. However, other adhesives suitable for adhering the protection structure and the substrate are available to be used in the invention and are not limited by this embodiment.

In addition, during the adhering of the flat protection structure 200a to the substrate 110, a pressing procedure is usually used to position the flat protection structure 200a and the substrate 110 closer and tighter. In order to prevent the flat protection structure 200a from crushing the wall 104 of the color-changeable pixel 100, or to prevent the protection structure from being shifted or tilted to the substrate 110 by an external force, the preferred embodiment adds spacers into the adhesive 202.

The adhesive 202 with spacers keeps a predetermined distance between the flat protection structure 200a and the substrate 110 and prevents the flat protection structure 200a from damaging the color-changeable pixel 100. In one example of the preferred embodiment, the size of the spacers is about 100 μm, and the size of the color-changeable pixel 100 is typically less than 1 μm. Therefore, there is a very large distance between the flat protection structure 200a and the wall 104, thus avoiding the foregoing possibility of being crushed.

Figure 2B:
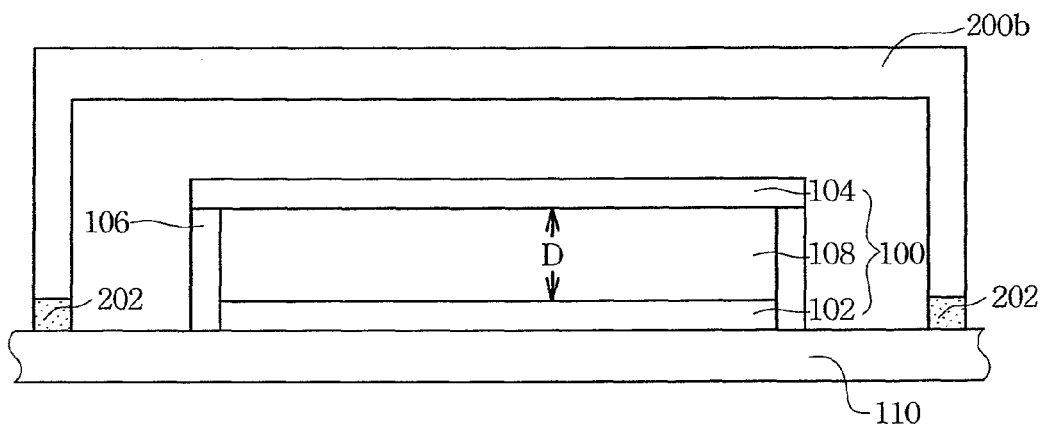
FIG. 2B illustrates a cross-sectional view of another preferred embodiment of the invention.

FIG. 2B illustrates a cross-sectional view of another preferred embodiment of the invention. In this preferred embodiment, the protection structure is a U-shaped protection structure 200b. The U-shaped protection structure 200b is a flat protection structure having extended sides. Similarly, the U-shaped protection structure 200b is adhered to the substrate 110 with the adhesive to isolate the color-changeable pixel 100 from water, dust and oxygen in the air and also to prevent the color-changeable pixel 100 from being damaged by an external force.

Figure 3A:
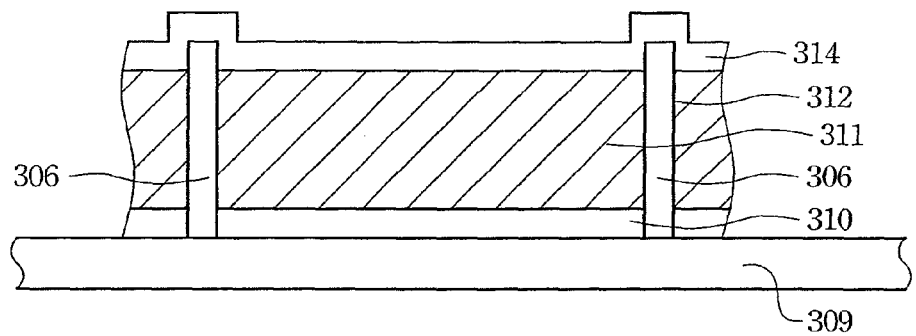
FIGS. 3A to 3C depict a manufacturing method of one preferred embodiment of the invention.
Figure 3B:
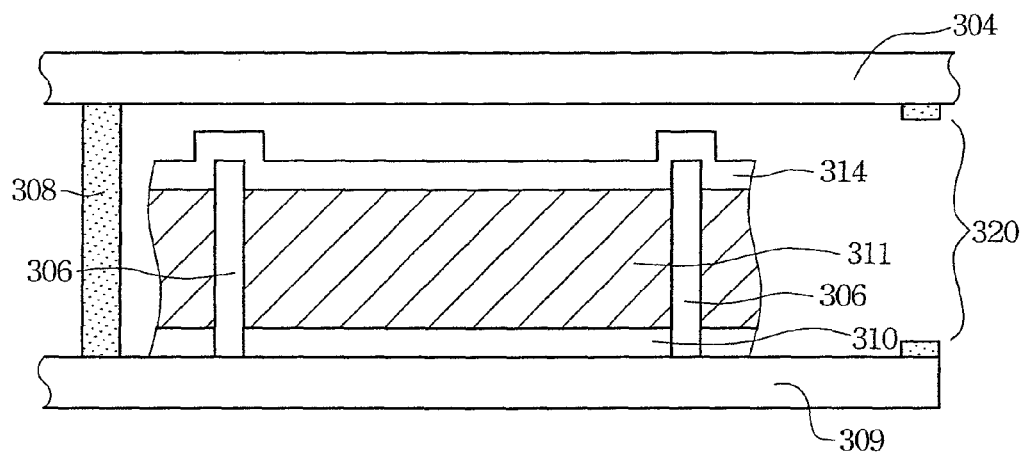
Figure 3C:
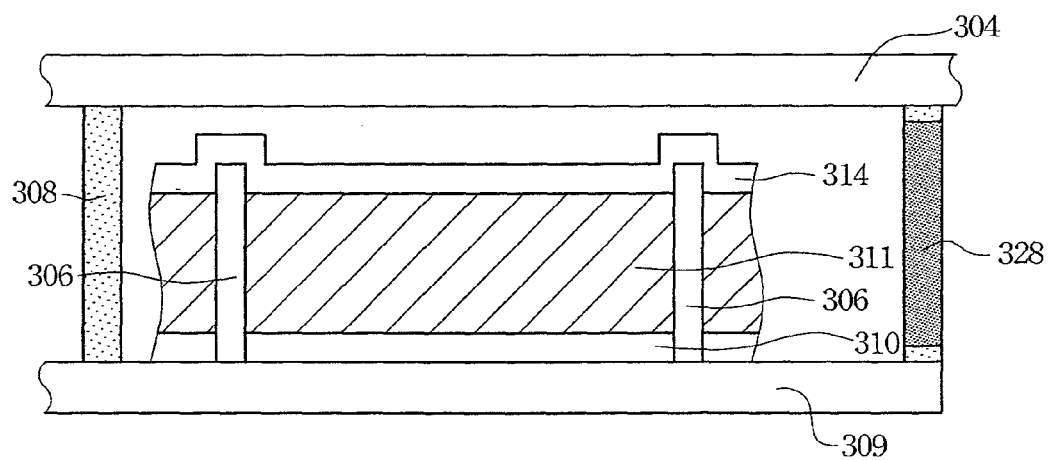

FIGS. 3A to 3C depict a manufacturing method of a preferred embodiment of the invention. For clarity and ease of understanding, the following descriptions and figures use only one color-changeable pixel to represent the optical interference reflection structure. Reference is first made to FIG. 3A in which a first electrode 310 and a sacrificial layer 311 are formed in order on a transparent substrate 309. The material of the sacrificial layer 311 is dielectric, metal or silicon. Openings 312 are formed in the first electrode 310 and the sacrificial layer 311, and every opening 312 is suitable for forming one support 306 therein. Next, supports 306 are formed in the openings 312, and a second electrode 314 is formed on the sacrificial layer 311 and the supports 306 to form a micro electro mechanical structure.

Reference is made to FIG. 3B in which a flat protection structure 304 is adhered to the substrate 309 with an adhesive 308 to enclose the micro electro mechanical structure therein. At least one opening 320 is preserved in the adhesive 308. Moreover, a pressing procedure is used to make the adhesion between the flat protection structure 304 and the substrate 309 closer and tighter. In addition, if the adhesive 308 is a thermosetting adhesive, a heating procedure can be used to heat the thermosetting adhesive so as to solidify and fix it.

The sacrificial layer 311 is removed by a release etching process, such as a remote plasma etch process, through the opening 320 with an etching reagent to form a cavity (not illustrated in the figures). The depth D of the cavity is the thickness of the sacrificial layer 311. The remote plasma etching process etches the sacrificial layer 311 with a remote plasma produced by an etching reagent having a fluorine group or a chlorine group, such as CF4, BCl3, NF3, or SF6, as a precursor.

As illustrated in FIG. 3C, when the foregoing release etching process is finished, after purging the etching reagent by air extraction or by other methods, the opening 320 is then closed with an adhesive 328 in order to hermetically seal the chamber between the protection structure 304 and the substrate 309. The adhesive 328 can be a UV glue or a thermosetting adhesive. According to another preferred embodiment of the invention, other objects can be used to close the opening 320, such as plastic or other polymeric material, or metal, and are not limited by the UV glue or thermosetting adhesive used in this embodiment.

The adhesive 328 used to close the opening 320 need not comprise spacers; and in some cases, the adhesive 308 and the adhesive 328 may not be the same material. The adhesive 308 comprises spacers in order to keep a predetermined distance between the flat protection structure 304 and the substrate 309, but the adhesive 328 is only used to close the opening 320 and therefore does not need to comprise spacers.

The foregoing description explains the method for manufacturing the optical interference display panel having the flat protection structure. The manufacturing method for the optical interference display panel having the U-shaped protection structure is similar and is described below for added clarity.

First, a micro electro mechanical structure, which comprises the first electrode, the second electrode and the sacrificial layer therebetween, is formed on the substrate. Then, a U-shaped protection structure is adhered to the substrate to form a chamber, such that the micro electro mechanical structure is positioned between the U-shaped protection structure and the substrate. Next, through an opening in the adhesive, a release etching process is performed to remove the sacrificial layer in the micro electro mechanical structure. The opening is then sealed with adhesive. A pressing procedure is used to make the adhesion between the U-shaped protection structure and the substrate closer and tighter.

Figure 4A:
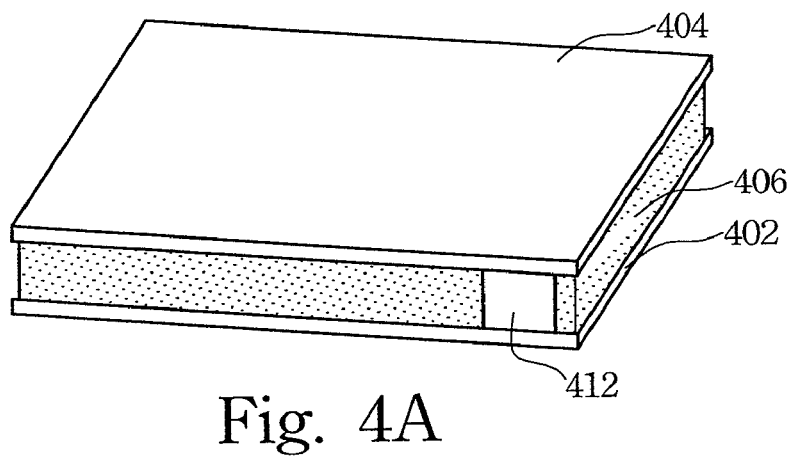
FIG. 4A illustrates a three-dimensional view of another preferred embodiment of the invention.
Figure 4B:
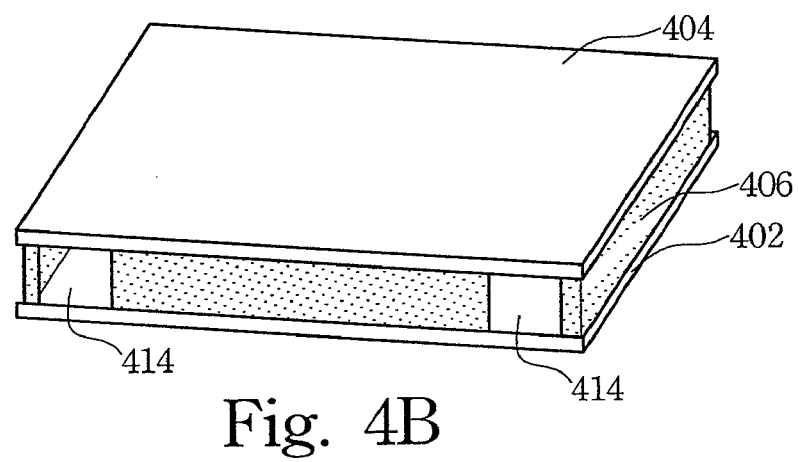
FIG. 4B illustrates a three-dimensional view of another preferred embodiment of the invention.
Figure 4C:
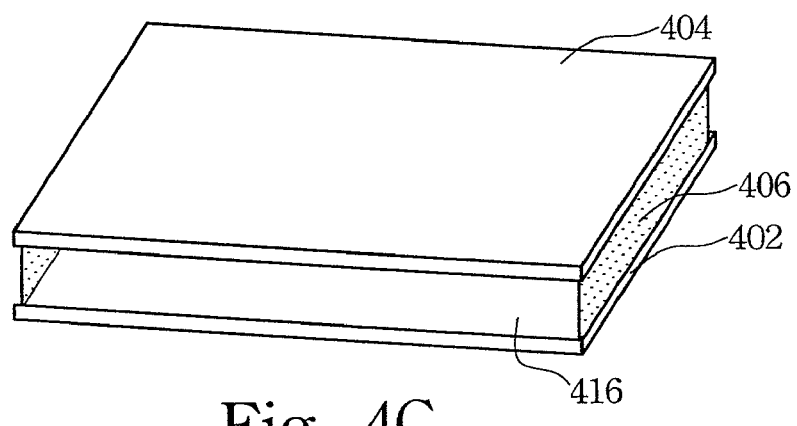
FIG. 4C illustrates a three-dimensional view of another preferred embodiment of the invention.

FIGS. 4A to 4C illustrate three-dimensional views of several embodiments of the invention to illustrate the configuration and shape of the opening in FIG. 3B. As shown in FIG. 4A, the opening 412 is located on the adhesive 406. The shape and position of the opening 412 are not limited to any specific geometry or location. When the size of the opening 412 is larger, the etching efficiency of the release etching process is better.

Moreover, the quantity of the openings 412 can be more than one. As illustrated in FIG. 4B, two openings 414 are in the adhesive 406. When the quantity of the openings 414 is greater, the etching efficiency of the release etching process is better. Furthermore, if the positions of the openings 414 are uniformly distributed on the adhesive 406, the uniformity of the etching process is enhanced.

In addition, according to another embodiment of the invention, the opening can even be extended to include one whole side between the substrate 402 and the flat protection structure 404, as an opening 416 depicts in FIG. 4C. During adhering the flat protection structure 404 to the substrate 402 with the adhesive 406, one side (which would normally be occupied by the adhesive 406) is preserved to act as the opening 416 such that the etching reagent may be easily applied during the subsequent release etching process.

The opening can be formed by cutting or by other methods after the substrate and the protection structure are adhered together and hermetically sealed with the adhesive. Alternatively, the opening can be preserved during the adhering procedure.

The opening, besides being positioned on the adhesive as in the above embodiments, can be positioned on the sidewall of the protection structure when the protection structure is a U-shaped protection structure.

Figure 5A:
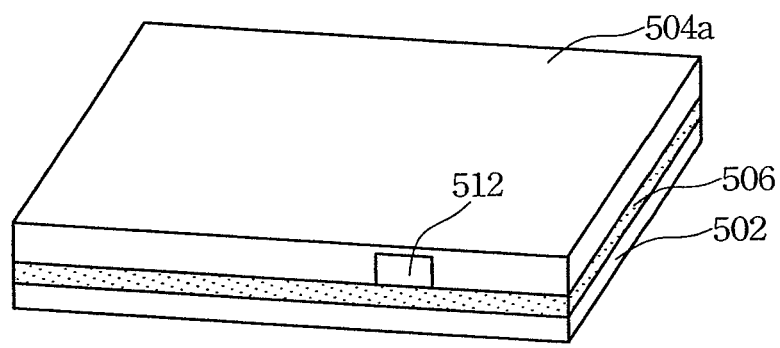
FIG. 5A illustrates a three-dimensional view of another preferred embodiment of the invention.
Figure 5B:
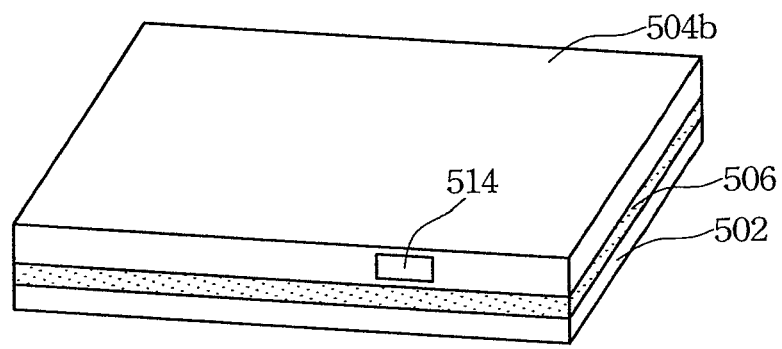
FIG. 5B illustrates a three-dimensional view of another preferred embodiment of the invention.
Figure 5C:
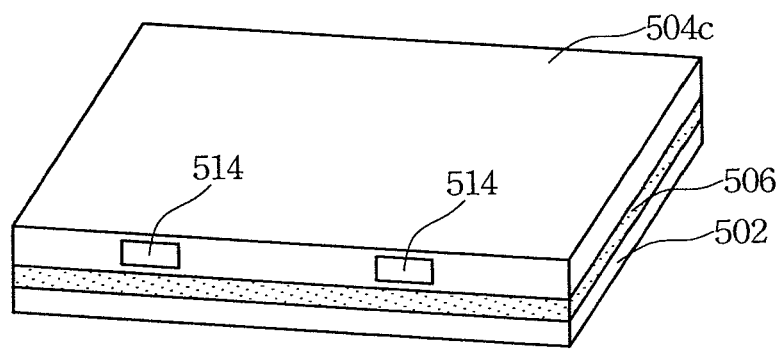
FIG. 5C illustrates a three-dimensional view of another preferred embodiment of the invention.

FIGS. 5A to 5C illustrate three-dimensional views of several embodiments of the invention that are useful for illustrating how the opening is positioned on the sidewall of the U-shaped protection structure. As shown in FIG. 5A, the opening 512 is on a sidewall of the U-shaped protection structure 504a. The U-shaped protection structure 504a is adhered to the substrate with an adhesive to form a chamber which encloses the optical interference reflection structure (not illustrated in the figure). The position of the opening is not limited and when the size of opening is larger, the etching efficiency of the release etching process is better.

Moreover, the quantity of the openings can be more than one. As illustrated in FIG. 5C, two openings 514 are on the sidewall of the U-shaped protection structure 504c. When the quantity of the openings is greater, the etching efficiency of the release etching process is better. Furthermore, if the positions of the openings are uniformly distributed about the U-shaped protection structure, the uniformity of the etching process is enhanced.

The invention adheres the protection structure to the substrate with an adhesive to form a chamber that encloses the micro electro mechanical structure prior to performing the release etching process. The sidewall of the chamber has at least one opening to be used for removal of the sacrificial layer during the release etching process. Thus, the optical interference reflection structure is prevented from being damaged by water, dust and oxygen as a result of being exposed to air during subsequent manufacturing procedures.

The protection structure is adhered to the substrate to enclose the micro electro mechanical structure in order to protect the micro electro mechanical structure from being acted upon directly and thereby being damaged by an external force. Furthermore, the optical interference reflection structure is hermetically sealed between the substrate and the protection structure, effectively preventing an external environment, such as water, dust or oxygen in the air, from being in contact with the optical interference reflection structure and consequently generating electrostatic attraction or oxidizing its metal film which adversely affects its optical or electrical properties. Therefore, the invention enhances the display performance of the optical interference display panel, increases its reliability, and prolongs its lifetime.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An optical interference display panel, comprising:
   a substrate;
   a protection structure;
   a micro electro mechanical structure comprising a sacrificial layer disposed between a first electrode and a second electrode of the micro electro mechanical structure; and
   an adhesive, adhering the protection structure to the substrate to form at least one cavity for enclosing the micro electro mechanical structure, wherein a sidewall of the cavity has an opening for input of an etching reagent used to remove the sacrificial layer and form an optical interference reflection structure.

2. The optical interference display panel of claim 1, wherein the micro electro mechanical structure further comprises:
   a plurality of supports, located in the sacrificial layer, for supporting the first electrode and the second electrode.

3. The optical interference display panel of claim 1, wherein the protection structure is a flat protection structure or a U-shaped protection structure.

4. The optical interference display panel of claim 1, wherein the protection structure is a U-shaped protection structure, and the opening is positioned on a sidewall of the U-shaped protection structure.

5. The optical interference display panel of claim 1, wherein the adhesive comprises spacers, and the spacers keep a predetermined distance between the protection structure and the substrate to prevent the protection structure from damaging the optical interference reflection structure.

6. The optical interference display panel of claim 1, wherein the adhesive comprises a UV glue or a thermosetting adhesive.

7. The optical interference display panel of claim 1, wherein the sacrificial layer comprises at least one of the following: dielectric material, metal, and silicon.

8. The optical interference display panel of claim 1, wherein the opening is located in the adhesive.

9. The optical interference display panel of claim 1, wherein there are two or more openings, and wherein the openings are uniformly distributed in the adhesive.

10. The optical interference display panel of claim 1, wherein the opening includes one whole side between the protection structure to the substrate.

11. The optical interference display panel of claim 1, wherein the micro electro mechanical structure comprises a plurality of pixels.

12. The optical interference display panel of claim 1, wherein the protection structure comprises at least one of the following: glass, plastic, organic polymer, and inorganic polymer.

13. An electronic display comprising:
a substrate;
a protection structure;
an optical interference structure comprising a sacrificial layer; and
an adhesive, adhering the protection structure to the substrate to form at least one cavity for enclosing the optical interference structure, wherein the adhesive comprises an opening.

14. The display of claim 13, wherein the optical interference structure comprises at least one modulator.

15. The display of claim 13, wherein the optical interference structure comprises a first electrode and a second electrode, and the sacrificial layer is located between the first electrode and the second electrode.

16. The display of claim 13, wherein the protection structure is substantially parallel with the substrate.

17. The display of claim 13, wherein the protection structure is a U-shaped protection structure, and the opening is positioned on a sidewall of the adhesive.

18. The display of claim 13, wherein the optical interference structure comprises one or more pixels.

* * * * *